United States Patent
Jung et al.

(10) Patent No.: US 11,527,718 B2
(45) Date of Patent: Dec. 13, 2022

(54) MASK ASSEMBLY AND ORGANIC LIGHT EMITTING DISPLAY DEVICE MANUFACTURED USING THE SAME

(71) Applicant: Samsung Display Co., Ltd., Yongin-si (KR)

(72) Inventors: Sungwoo Jung, Cheonan-si (KR); Soonjung Wang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 16/366,687

(22) Filed: Mar. 27, 2019

(65) Prior Publication Data

US 2019/0305222 A1 Oct. 3, 2019

(30) Foreign Application Priority Data

Mar. 29, 2018 (KR) .......................... 10-2018-0036322

(51) Int. Cl.
*C23C 14/04* (2006.01)
*H01L 51/00* (2006.01)
*H01L 27/32* (2006.01)
*H01L 51/52* (2006.01)
*H01L 51/56* (2006.01)

(52) U.S. Cl.
CPC ........ *H01L 51/0011* (2013.01); *C23C 14/042* (2013.01); *H01L 27/3244* (2013.01); *H01L 51/001* (2013.01); *H01L 51/5253* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 9,284,638 B2* | 3/2016 | Ko | B05C 21/005 |
| 2006/0103289 A1* | 5/2006 | Kim | B05B 12/20 313/402 |
| 2012/0234236 A1* | 9/2012 | Ko | B05B 12/20 118/504 |
| 2013/0314686 A1* | 11/2013 | Kim | G03F 7/70733 355/74 |
| 2014/0331926 A1* | 11/2014 | Kim | C23C 14/042 118/504 |

(Continued)

FOREIGN PATENT DOCUMENTS

| KR | 10-2015-0049005 A | 5/2015 |
|---|---|---|
| KR | 10-2017-0045427 A | 4/2017 |

*Primary Examiner* — Daniel Whalen
(74) *Attorney, Agent, or Firm* — Lewis Roca Rothgerber Christie LLP

(57) ABSTRACT

A mask assembly and an organic light emitting display device manufactured using the mask assembly are capable of realizing an organic light emitting display device having a hole in a display area, the mask assembly including a frame defining a first opening area, a first mask on the frame and defining a plurality of second opening areas that overlap the first opening area, and a second mask fixed to the frame across the plurality of second opening areas, and including a body portion overlapping the first mask, a blocking portion at each respective one of the second opening areas, and a pattern portion between the body portion and the blocking portion, and defining a plurality of holes.

11 Claims, 13 Drawing Sheets

(56) References Cited

U.S. PATENT DOCUMENTS

| | | | |
|---|---|---|---|
| 2016/0023230 A1* | 1/2016 | Ko | H01J 11/48 |
| | | | 118/504 |
| 2017/0110062 A1* | 4/2017 | Zhang | G09G 3/3696 |
| 2017/0110661 A1* | 4/2017 | Lee | H01L 51/0004 |
| 2017/0117474 A1* | 4/2017 | Kim | H01L 27/3244 |
| 2017/0141314 A1* | 5/2017 | Moon | H01L 51/0023 |
| 2017/0162833 A1* | 6/2017 | Moon | C25D 1/10 |
| 2017/0222145 A1* | 8/2017 | Kim | H01L 51/0011 |
| 2018/0148823 A1* | 5/2018 | Yoo | C25D 1/08 |

\* cited by examiner

MASK ASSEMBLY AND ORGANIC LIGHT EMITTING DISPLAY DEVICE MANUFACTURED USING THE SAME

CROSS-REFERENCE TO RELATED APPLICATION

This application claims priority to, and the benefit of, Korean Patent Application No. 10-2018-0036322, filed on Mar. 29, 2018, in the Korean Intellectual Property Office (KIPO), the disclosure of which is incorporated by reference herein in its entirety.

BACKGROUND

1. Field

Embodiments of the present invention relate to a mask assembly, and to an organic light emitting display device manufactured using the mask assembly.

2. Discussion of Related Art

Display devices may be classified into liquid crystal display ("LCD") devices, organic light emitting diode ("OLED") display devices, plasma display panel ("PDP") devices, electrophoretic display devices, or the like based on a light emitting scheme thereof.

Among these, OLED display devices are garnering attention as an ideal display device of the next generation because they have excellent display characteristics, such as a contrast ratio and a response time, and are easy to be implemented as flexible display devices.

In general, OLED display devices have a structure in which a cathode and an anode surround several layers of thin films, which includes organic materials, on a substrate. Upon applying a voltage to the cathode and the anode, a current is caused to flow in the organic thin film such that a light emission phenomenon may occur. That is, organic molecules may be excited to an excited state upon current introduction, and when they return to the ground state, the extra energy is emitted as a light. As such, in order to form an OLED display device including a plurality of organic thin film layers, an organic thin film is deposited over the entire substrate.

The types of masks used in such a deposition process may include a fine metal mask ("FMM") that is used to perform a precise patterning depending on a location in a display area of each display device, and an open mask that is used when forming a common thin film layer over the entire display area. For example, when a deposition material should be precisely deposited only at a predetermined pixel position in the display area, such as a light emission layer, the fine metal mask is used. On the other hand, when a deposition material should be deposited over the entire display area, such as an electron injection layer, an electron transporting layer, a hole injection layer, and a hole transporting layer, the open mask whose entire area is open is used.

In recent times, as a display device including a narrow bezel is sought after, at least one of a camera hole, a sensor hole, an LED hole, and a speaker hole may be positioned within the display area of the display device. Accordingly, it may be suitable to manufacture an open mask including a pattern corresponding to the hole.

It is to be understood that this background of the technology section is intended to provide useful background for understanding the technology, and as such, information disclosed in the technology background section may include ideas, concepts, or recognitions that were not part of what was known or appreciated by those skilled in the pertinent art prior to a corresponding effective filing date of subject matter disclosed herein.

SUMMARY

Embodiments of the present invention may be directed to a mask assembly capable of realizing an organic light emitting display device having a hole in a display area, and to an organic light emitting display device manufactured using the mask assembly.

According to an embodiment, a mask assembly includes a frame defining a first opening area, a first mask on the frame and defining a plurality of second opening areas that overlap the first opening area, and a second mask fixed to the frame across the plurality of second opening areas, and including a body portion overlapping the first mask, a blocking portion at each respective one of the second opening areas, and a pattern portion between the body portion and the blocking portion, and defining a plurality of holes.

The second mask may extend in a lengthwise direction of the first mask.

The second mask may extend in a widthwise direction of the first mask.

The blocking portion may have a width substantially equal to a width of the pattern portion.

The blocking portion and the pattern portion may have an area in a range from about 1% to about 50% of an area of the second opening areas.

The plurality of holes may have an area in a range from about 50% to about 80% of an area of the pattern portion.

The second mask may have a thickness in a range from about 80 μm to about 300 μm.

A shape of each of the plurality of holes may include one of a circle, an ellipse, or a polygon on a plane.

The frame may define a groove at a position overlapping the second mask, wherein a shape of the second mask corresponds to being inserted into the groove.

The second mask may be bent at an end thereof to extend toward a side surface of the frame, and may be fixed to the frame.

Each of the first mask and the second mask may include one of stainless steel (SUS), an invar alloy, nickel (Ni), cobalt (Co), a nickel alloy, or a nickel-cobalt alloy.

According to an embodiment, an organic light emitting display device includes a substrate having a display area, a first non-display area in the display area, and a second non-display area around the display area, a plurality of first pixel electrodes on the substrate at the display area, a functional member corresponding to the first non-display area, and an organic layer on the first pixel electrode, defining a first hole at the first non-display area, and including an organic pattern portion in the display area and adjacent to the first hole.

The organic pattern portion may have a width substantially equal to a width of the first hole.

The organic pattern portion may surround the first hole.

The organic pattern portion may have a shape of a circle, an ellipse, or a polygon repeatedly arranged on a plane.

Each of the shapes of the organic pattern portion may overlap one of the first pixel electrodes on a plane.

Each of the shapes of the organic pattern portion may overlap two to eight of the first pixel electrodes on a plane.

The organic layer may include one of an electron injection layer, an electron transporting layer, a hole injection layer, a hole transporting layer, and an organic light emitting layer.

The organic light emitting display device may further include a second pixel electrode on the organic layer.

The organic light emitting display device may further include a thin film encapsulation layer on the organic layer over an entire surface of the substrate.

The foregoing is illustrative only, and is not intended to be in any way limiting. In addition to the illustrative aspects and embodiments described above, further aspects and embodiments will become apparent by reference to the drawings, and the following detailed description.

BRIEF DESCRIPTION OF THE DRAWINGS

A more complete appreciation of the present invention will become more apparent by describing in detail embodiments thereof with reference to the accompanying drawings, wherein.

DETAILED DESCRIPTION

Figure 1:
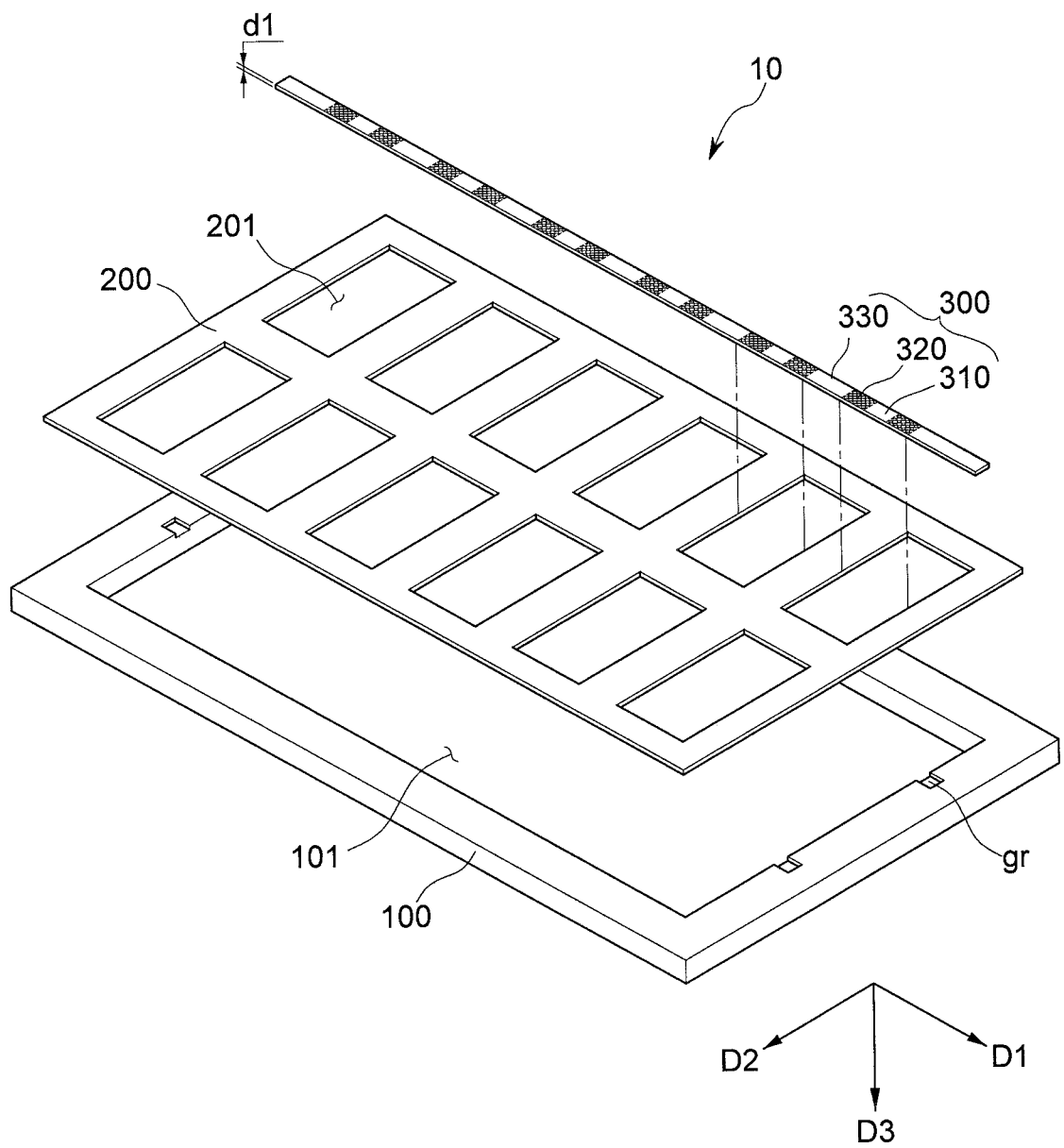
FIG. 1 is an exploded perspective view illustrating a mask assembly according to an embodiment of the present invention.

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, when a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention and like reference numerals refer to like elements throughout the specification.

Hereinafter, a mask assembly according to an embodiment of the present invention will be described in detail with reference to FIGS. 1 to 3. As used herein, the term "mask assembly" may refer to, for example, a deposition mask assembly or any other mask assembly used to deposit or place materials in a desired form or manner.

Figure 2:
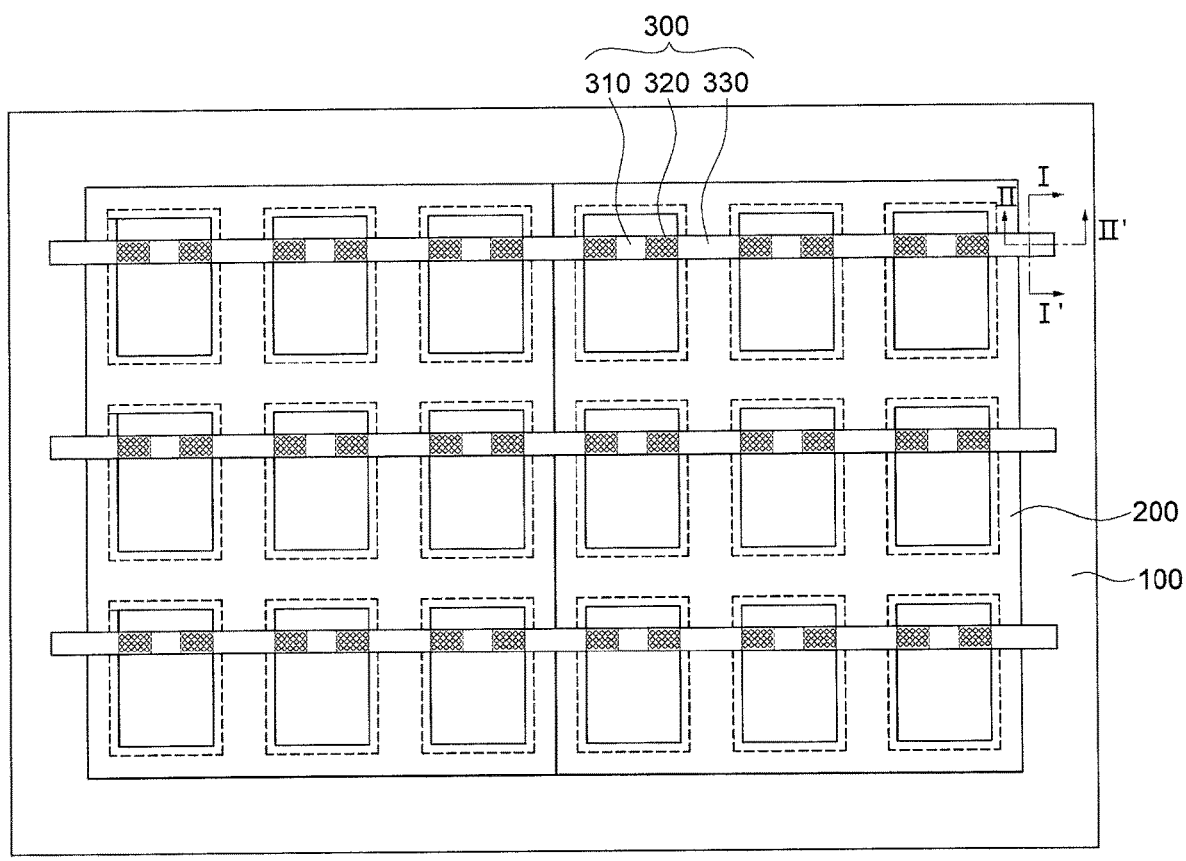
FIG. 2 is a plan view illustrating a mask assembly according to an embodiment of the present invention.
Figure 3:
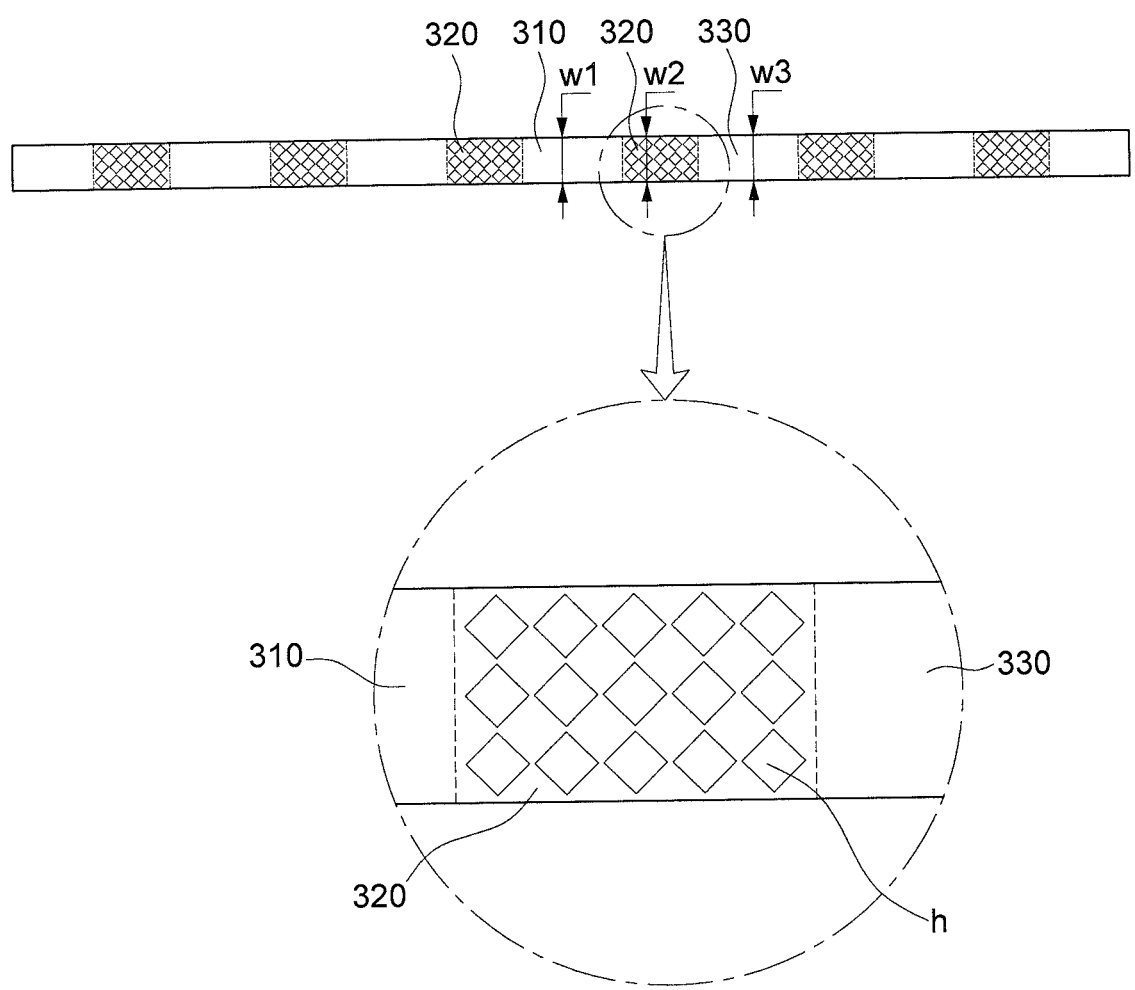
FIG. 3 is a plan view illustrating a part of a second mask of FIG. 1 and an enlarged view of the second mask.

FIG. 1 is an exploded perspective view illustrating a mask assembly according to an embodiment of the present invention, FIG. 2 is a plan view illustrating a mask assembly according to an embodiment of the present invention, and FIG. 3 is a plan view illustrating a part of a second mask of FIG. 1 and an enlarged view of the second mask.

Referring to FIGS. 1 to 3, a mask assembly 10 according to an embodiment of the present invention includes a frame 100, a first mask 200, and a second mask 300. As used herein, for ease of description, a long side direction (e.g., a lengthwise direction) of the frame 100 is referred to as a first direction D1, a short side direction (e.g., a widthwise direction) of the frame 100 is referred to as a second direction D2, and a thickness direction of the frame 100 is referred to as a third direction D3.

The frame 100 defines a first opening area 101 that is located at the center of the frame 100. For example, as illustrated in FIG. 1, the frame 100 may have a quadrangular ring shape corresponding to a substrate that is to undergo deposition, and may have the first opening area 101 having a quadrangular shape at the center of the frame 100 to perform the deposition process of the substrate.

The frame 100 supports the first mask 200 to be placed thereon. In addition, opposite end portions of the second mask 300 to be described below are to be placed and fixed on the frame 100. To this end, at least part of the frame 100 may have grooves gr, which will be described in detail below.

The first mask 200 may be, for example, an open mask. The first mask 200 is placed on the frame 100. The first mask 200 has a quadrangular plate shape corresponding to the frame 100, for example. The first mask 200 may include one of stainless steel (SUS), an invar alloy, nickel (Ni), cobalt (Co), a nickel alloy, and a nickel-cobalt alloy.

The first mask 200 defines a plurality of second opening areas 201. The plurality of second opening areas 201 are located above the first opening area 101. In such an embodiment, one second opening area 201 corresponds to one display device area. For example, as illustrated in FIG. 1, the first mask 200 according to an embodiment of the present invention may have twelve second opening areas 201, and accordingly, the first mask 200 may have a size corresponding to twelve display device areas (e.g., twelve display device areas respectively corresponding to twelve display devices). However, embodiments are not limited thereto, and the number and size of the second opening areas 201 may be determined in consideration of the process conditions of the display device. The deposition material may pass through the first opening area 101 and the plurality of second opening areas 201 to be deposited on the substrate of the display device(s).

The first mask 200 may be fixed on the frame 100 under a tensile force in first and second directions D1 and D2. For example, the first mask 200 may be fixed on the frame 100 in a welding manner. The welding may be spot welding. In the spot welding method, a plurality of welding points are set to perform welding for each welding point, and thus deformation of the first mask 200 during welding may be significantly reduced. The welding points may be, for example, in the form of at least one column or zigzag.

As such, the frame 100 may receive a compressive force, which is a reaction to the tensile force, in the first and second directions D1 and D2, and the frame 100 may be deformed by heat that may be generated during welding. Thus, to substantially reduce or minimize the deformation due to the compressive force or heat acting on the frame 100, the frame 100 includes a metal having high rigidity.

The second mask 300 (which is, for example, an auxiliary mask) is located on the first mask 200. The second mask 300 has, for example, a stick shape, as illustrated in FIG. 1. The second mask 300 may include a material substantially the same as a material included in the first mask 200.

The second mask 300 is located on the first mask 200 across the plurality of second opening areas 201 arranged along at least one direction. For example, as illustrated in FIG. 1, a second mask 300 according to an embodiment of the present invention may be located across six second opening areas 201 arranged along the first direction D1. Although one second mask 300 is shown in FIG. 1 for ease of description, a plurality of second masks 300 may be located across a plurality of second opening areas 201 arranged along one direction. As an example, as illustrated in FIG. 1, when twelve second opening areas 201 are defined in two columns each including six of the second opening areas 201 arranged along the first direction D1, two second masks 300 each located across six of the second opening areas 201 that are arranged along the first direction D1 may be provided. As another example, as illustrated in FIG. 2, when eighteen second opening areas 201 are defined in the columns each including six of the second opening areas 201 arranged along the first direction D1, there may be provide three second masks 300 each located across two or more (e.g., six) of the second opening areas 201. In addition, opposite end portions of the second masks 300 may be fixed to the frame 100 while overlapping the frame 100, which will be described in more detail below.

Referring to FIGS. 1 to 3, the second mask 300 includes a blocking portion 310 located at each of the plurality of second opening areas 201 of the first mask 200 corresponding to the second mask 300, a body portion 330 overlapping the first mask 200, and a pattern portion 320 located between the blocking portion 310 and the body portion 330 and having a plurality of holes. That is, one blocking portion 310 and the pattern portions 320 that are located on opposite sides of the one blocking portion 310 are located in each of the second opening areas 201 of the first mask 200.

The blocking portion 310 overlaps a non-display area of a display device that is within a display area of the display device, during a deposition process forming a common layer of the display device. For example, the blocking portion 310 may correspond to a hole within the display area of the display device (e.g., and in the descriptions below with reference to FIG. 8, the hole H located in a non-display area in the display area). In such an embodiment, the hole H may be one of a camera hole, a sensor hole, an LED hole, and/or a speaker hole of the display device.

As display devices having a narrow bezel are in demand recently, at least one of a camera hole, a sensor hole, an LED hole, and/or a speaker hole may be located in the display area of the display device. In such an embodiment, in the deposition process using a mask, a deposition material should not be deposited in the hole H located in the display area. As the mask assembly 10 according to an embodiment of the present invention includes the second mask 300 including the blocking portion 310, the deposition material may not be deposited in the area corresponding to the hole H located in the display area.

The blocking portion 310 may have one of a circular shape, an elliptical shape or a polygonal shape on a plane. For example, as illustrated in FIGS. 1 to 3, the blocking portion 310 may have a quadrangular shape on a plane. However, embodiments are not limited thereto, and the blocking portion 310 may have a shape corresponding to the planar shape of the hole H located in the display area of the display device on a plane. In addition, the blocking portion 310 may have a size corresponding to a planar size of the hole H located in the display area of the display device on a plane. That is, the shape and size of the blocking portion 310 on a plane may be determined in consideration of the shape and size, on a plane, of the hole H located in the display area of the display device.

Referring to FIG. 3, the pattern portion 320 has a plurality of holes h. Each of the holes h has a shape of a circle, an ellipse, or a polygon on a plane. For example, as illustrated in FIG. 3, each of the holes h may have a rhombic shape on a plane.

The pattern portion 320 overlaps the display area of the display device during the deposition process for forming the common layer of the display device. In the deposition process using the mask assembly 10 according to an embodiment of the present invention, the deposition material may be deposited on the substrate of the display device through each hole h of the pattern portion 320. Accordingly, the deposition material may be deposited on the substrate of the display device having a planar shape corresponding to the planar shape of each hole h of the pattern portion 320.

In an embodiment, a common layer may be formed in pixels that are arranged on the substrate of the display device in the display area. In such an embodiment, the pixel refers to the smallest unit for displaying images. To this end, the pattern portion 320 is located so that each of the holes h of the pattern portion 320 is located on a respective one or more of the pixels of the display device. As an example, each hole h of the pattern portion 320 may overlap one pixel of the display device. As another example, each hole h of the pattern portion 320 may overlap two, four, eight, or more pixels. To this end, each hole h of the pattern portion 320 has a size corresponding to one, two, four, eight, or more pixels.

In order to stably perform the function of the common layer even though the common layer that has been located over the entire surface of the conventional display devices is formed into a pattern shape, it is desirable that the pattern portion 320 have a large number of holes h having an area as large as possible. However, when the holes h of the pattern portion 320 have an excessively large area, or are too large in number, the second mask 300 may be cut off, or may break, when the second mask 300 is stretched to be fixed on the first mask 200 and the frame 100. On the other hand, when the holes h of the pattern portion 320 have a small area or are small in number, the interval between the light emitting pixels may be widened and the resolution of the display device may be degraded. According to an embodiment of the present invention, the total planar area of the holes h of the pattern portion 320 may be in the range from about 50% to about 80%. For example, the total planar area of the holes h of the pattern portion 320 may be about 65% (e.g., about 65% of the entire area of the pattern portion). However, embodiments are not limited thereto, and the number and area of the holes h of the pattern portion 320 may be determined in consideration of process conditions of the display device and resolution of the display apparatus.

The body portion 330 serves to connect one pattern portion 320 located above one second opening area 201 and another pattern portion 320, which is adjacent to the one pattern portion 320, located above another second opening area 201 that is adjacent to the one second opening area 201.

As illustrated in FIG. 1, the second mask 300 may have a thickness dl in the range from about 80 μm to about 300 μm in the third direction D3. For example, the second mask 300 may have a thickness dl of about 100 μm. When the thickness dl of the second mask 300 is less than about 80 μm, the second mask 300 that is in the form of a stick and that includes the pattern portion 320 having a plurality of holes h may be cut off, or may break, when the second mask 300 is stretched to be fixed on the first mask 200 and the frame 100. On the other hand, when the thickness dl of the second mask 300 is more than about 300 μm, an additional shadow phenomenon may occur, and the precision of the deposition may be degraded. However, the thickness dl of the second mask 300 is not limited to the above range, and may be determined in consideration of the durability of the mask and the precision of deposition.

Referring to FIG. 3, a width w1 of the blocking portion 310 is substantially equal to a width w2 of the pattern portion 320. In addition, the width w1 of the blocking portion 310 is substantially equal to a width w3 of the body portion 330. In such an embodiment, the width w1 of the blocking portion 310, the width w2 of the pattern portion 320, and the width w3 of the body portion 330 each refer to a width in the direction perpendicular to a long side direction of the second mask 300. For example, as illustrated in FIG. 1, in an embodiment of the present invention, when the second mask 300 is located across the plurality of second opening areas 201 along the long side direction of the opening mask 200, the width w1 of the blocking portion 310, the width w2 of the pattern portion 320, and the width w3 of the body portion 330 are substantially equal to each other in the second direction D2. When the widths w2 and w3 of the pattern portion 320 and the body portion 330 are less than the width w1 of the blocking portion 310, the second mask 300 that is in the form of a stick and that includes the pattern portion 320 having a plurality of holes h may be cut off or may break when the second mask 300 is stretched to be fixed on the first mask 200 and the frame 100. On the other hand, when the width w2 of the pattern portion 320 is greater than the width w1 of the blocking portion 310, the manufacturing costs of the second mask 300 may unnecessarily increase. However, embodiments of the present invention are not limited thereto, and the widths w2 and w3 of the pattern portion 320 and the body portion 330 may be determined in consideration of the durability of the mask and the manufacturing costs, and may be different from the width w1 of the blocking portion 310.

As described above, as the blocking portion 310 has the size corresponding to the hole H located in the display area of the display device, and as the width w1 of the blocking portion 310 is substantially equal to the width w2 of the pattern portion 320 in the second direction D2, each of the blocking portion 310 and the pattern portion 320 is located in a partial area of the second opening area 201. For example, according to an embodiment of the present invention, when the second mask 300 is located across the plurality of second opening areas 201 arranged along the first direction D1, that is, along the long side direction of the first mask 200, the total area of the blocking portion 310 and the pattern portion 320 located at the second opening area 201 may be in a range from about 1% to about 20% of the total area of the second opening area 201 on a plane.

Although the second mask 300 according to an embodiment of the present invention is shown as being separated from the first mask 200, embodiments are not limited thereto. In an embodiment, the second mask 300 and the first mask 200 may be integrally formed into a unitary structure.

Figure 4A:
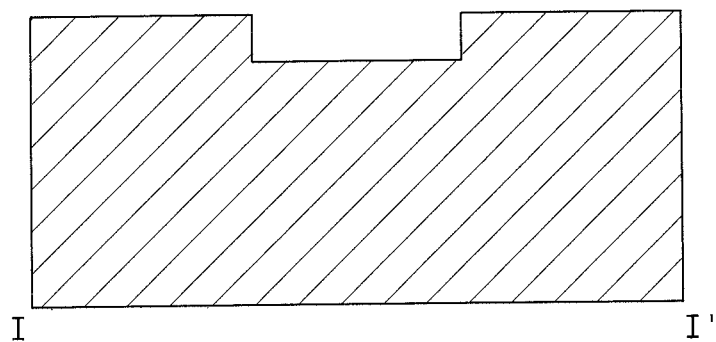
FIG. 4A is a cross-sectional view taken along the line I-I' in FIG. 2.
Figure 4B:
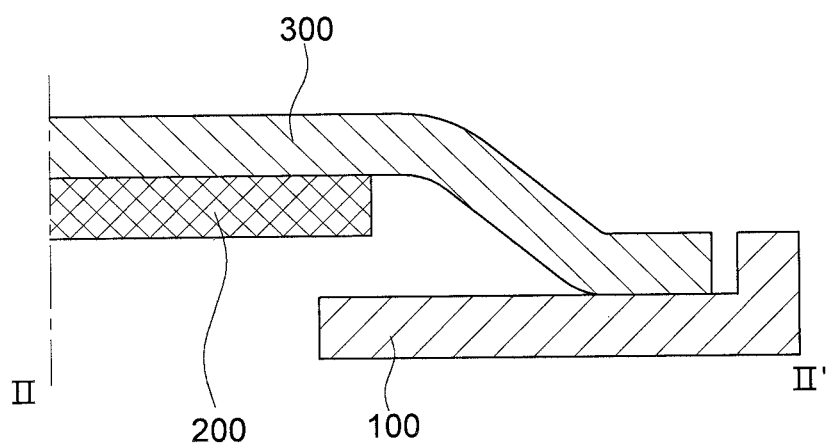
FIG. 4B is a cross-sectional view taken along the line II-I' in FIG. 2.

Hereinafter, the groove gr of the frame 100 will be described with reference to FIGS. 1, 2, 4A, and 4B. FIG. 4A is a cross-sectional view taken along the line I-I' in FIG. 2, and FIG. 4B is a cross-sectional view taken along the line II-I' in FIG. 2.

The frame 100 may have the groove gr at a portion of the frame 100 that overlaps the second mask 300. For example, as illustrated in FIG. 1, when the second mask 300 is located across the plurality of second opening areas 201 arranged along the first direction D1, the groove gr may be defined in each of opposite sides of an upper surface of the frame 100 that extend along the second direction D2. That is, when the second mask 300 is located extending along the long side direction of the frame 100, the groove gr may be defined on the upper surface of the frame 100 in the short side direction of the frame 100.

The groove gr of the frame 100 may be defined in the form corresponding to the shape of a portion of the second mask 300 that overlaps the groove gr. For example, as illustrated in FIG. 4A, the cross-section of the groove gr of the frame 100 may have a quadrangular shape. However, embodiments are not limited thereto, and the groove gr of the frame 100 may have various shapes that may fasten the second mask 300.

The second mask 300 may be inserted into the groove gr of the frame 100. For example, as illustrated in FIG. 4B, the second mask 300 may be bent to pass along the side surface of the first mask 200 to be inserted into the groove gr of the frame 100. In addition, the second mask 300 may be welded to the groove gr of the frame 100 and fixed thereto.

Figure 5:
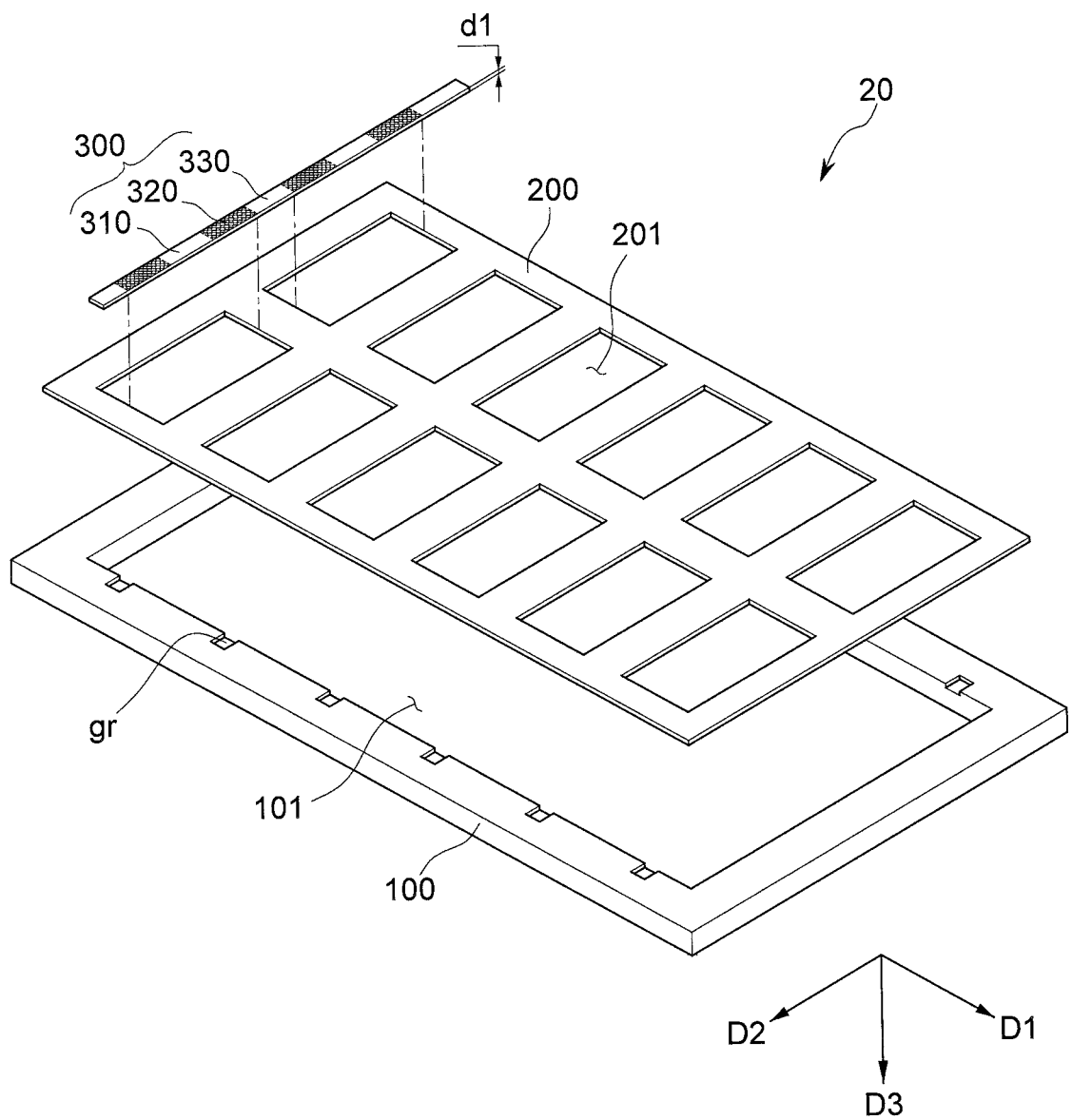
FIG. 5 is an exploded perspective view illustrating a mask assembly according to another embodiment of the present invention.

Hereinafter, a mask assembly 20 according to another embodiment of the present invention will be described with reference to FIG. 5. FIG. 5 is an exploded perspective view illustrating a mask assembly according to another embodiment of the present invention. Repeated description of the components of previously described embodiments that are the same as those according to the present embodiment is omitted from the description to avoid duplication.

Referring to FIG. 5, a mask assembly 20 according to another embodiment of the present invention includes a frame 100, a first mask 200, and a second mask 300.

The second mask 300 is located on the first mask 200 across a plurality of second opening areas 201 arranged along at least one direction. For example, as illustrated in FIG. 5, a second mask 300 according to the present embodiment may be located across two of the second opening areas 201 arranged along the second direction D2. Although one second mask 300 is shown in FIG. 5 for ease of description, a plurality of second masks 300 may be located across a plurality of second opening areas 201 arranged along one direction. As an example, as illustrated in FIG. 5, when twelve second opening areas 201 are defined in two columns, each column including six of the second opening areas 201 arranged along the first direction D1, six second masks 300 each located across two of the second opening areas 201 that are arranged along the second direction D2 may be provided.

The second mask 300 includes a respective blocking portion 310 located in each of the plurality of second opening areas 201 of the first mask 200, a body portion 330 overlapping the first mask 200, and a pattern portion 320 located between the blocking portion 310 and the body portion 330 and having a plurality of holes. As described hereinabove, as the blocking portion 310 has the size corresponding to the hole H located in the display area of the display device, and as the width of the blocking portion 310 is substantially equal to the width of the pattern portion 320 in the first direction, each of the blocking portion 310 and the pattern portion 320 is located in a partial area of the second opening area 201. For example, according to another embodiment of the present invention, when the second mask 300 is located in the second direction D2, that is, across the plurality of second opening areas 201 arranged along the short side direction of the first mask 200, the total area of the blocking portion 310 and the pattern portion 320 located at the second opening area 201 may be in the range from about 1% to about 50% of the total area of the second opening area 201 on a plane.

The frame 100 may have the groove gr at a portion of the frame 100 that overlaps the second mask 300. For example, as illustrated in FIG. 5, when the second mask 300 is located across the plurality of second opening areas 201 arranged along the second direction D2, the groove gr (e.g., a plurality of grooves gr) may be defined in opposite sides of an upper surface of the frame 100 that extend along the first direction D1. That is, when the second mask 300 extends along the short side direction of the frame 100, the groove gr may be defined on the upper surface of the frame 100 in the long side direction of the frame 100.

Hereinafter, a mask assembly according to still another embodiment of the present invention will be described. The mask assembly of the present embodiment includes a frame having a first opening area and a pattern mask located on the frame. The pattern mask includes a plurality of opening patterns located above the first opening area, and each of the plurality of opening patterns corresponds to one display device area. Each of the opening patterns includes a blocking portion corresponding to a hole located in a display area of a display device, and includes a pattern portion over the entire surface except the blocking portion. The pattern portion has a plurality of holes, and each of the holes may have a shape of a circle, an ellipse, and a polygon on a plane. Because the mask assembly according to the present embodiment includes the blocking portion and the pattern portion, the display device including a common layer corresponding to pixels in the display area and having a hole in the display area may be manufactured.

Figure 6:
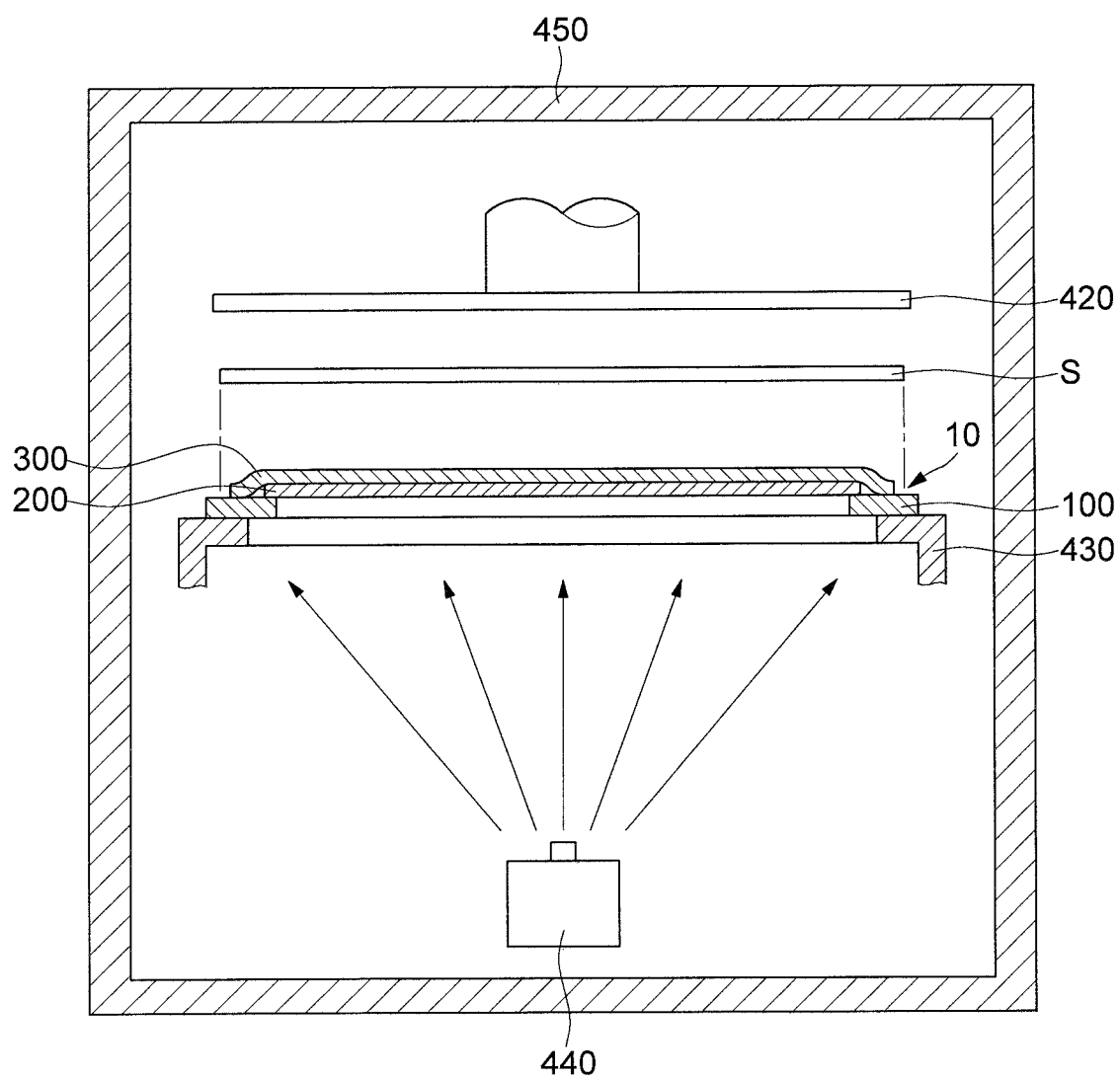
FIG. 6 is a cross-sectional view for explaining a deposition process of a display device using a mask assembly according to an embodiment of the present invention.

Hereinafter, a deposition process of a display device using a mask assembly according to an embodiment of the present invention will be described in detail with reference to FIG. 6. FIG. 6 is a cross-sectional view for explaining a deposition process of a display device using a mask assembly according to an embodiment of the present invention.

Referring to FIG. 6, a deposition apparatus according to an embodiment includes a mask assembly 10, a magnet unit 420, a fastening member 430, a deposition source 440, and a chamber 450.

The mask assembly 10 includes a frame 100, a first mask 200, and a second mask 300, and is located at an upper portion of, and within, the chamber 450 to face the deposition source 440.

The magnet unit 420 opposes the mask assembly 10 with the substrate S that is to undergo the deposition process interposed therebetween. The second mask 300 of the mask assembly 10 may be brought into close contact with the substrate S by a magnetic force from the magnet unit 420.

The fastening member 430 supports edges of the mask assembly 10. The fastening member 430 is located outside a movement path of the deposition material supplied from the deposition source 440 to the substrate S.

The deposition source 440 is located below the mask assembly 10. The deposition source 440 supplies the deposition material to the substrate S through the second opening area 201 of the first mask 200 and the plurality of holes h of the pattern portion 320 of the second mask 300. That is, the deposition material is supplied toward a deposition surface of the substrate S positioned at an upper portion of the inside of the chamber 450.

The deposition source 440 may be in the form of a crucible including a deposition material therein, and may vaporize the deposition material by heat to be deposited on the substrate S. The deposition process apparatus may further include a heater for heating the deposition material. The heater may be provided on opposite sides of the deposition source 440 to heat the deposition source 440, thereby heating and vaporizing the deposition material accommodated in the deposition source 440.

The chamber 450 provides a space in which the deposition process proceeds. The chamber 450 is connected to a vacuum pump, such as a turbo molecular pump (TMP), so that the inside of the chamber 450 may be maintained in a vacuum state during the deposition process. The chamber 450 may further include a deposition prevention plate surrounding an inner wall surface of the chamber 450. The deposition prevention plate reduces or substantially prevents a deposition material that is not deposited on the substrate S among the deposition materials sprayed from the deposition source 440 from being adsorbed on the inner wall surface of the chamber 450.

The substrate S is located on the mask assembly 10. The substrate S may be located so as to overlap the first opening area 101 of the mask assembly 10.

The deposition process apparatus may further include a thickness monitoring sensor for measuring a velocity of the deposition material and/or a thickness of the deposition material (e.g., on the substrate), a thickness controller for controlling the deposition source 440 according to the measured thickness, a shutter for blocking the deposition material vaporized from the deposition source 440, and the like. In addition, the deposition process apparatus may further include an aligner and a CCD camera located outside the chamber 450 for aligning the substrate S with the mask assembly 10.

Hereinafter, a process of depositing a deposition material on the deposition surface of the substrate S will be described.

First, the mask assembly 10 is fastened to the fastening member 430, and the substrate S is placed above the second mask 300.

Subsequently, the deposition source 440 located at a lower portion of the interior of the chamber 450 ejects the deposition material toward the mask assembly 10. For example, when a power is applied to a heater connected to the deposition source 440, the deposition source 440 accommodating the deposition material is heated, whereby the deposition material is heated and vaporized to be sprayed toward the mask assembly 10. In such an embodiment, the inside of the chamber 450 is maintained at a high degree of vacuum and a high temperature.

When the deposition material is sprayed, the deposition material is deposited over the deposition surface of the substrate S through the second opening area 201 of the first mask 200 and through the plurality of holes h of the pattern portion 320 of the second mask 300. In such an embodiment, because the mask assembly 10 according to the present embodiment includes the second mask 300 that includes the blocking portion 310 and the pattern portion 320, the deposition material is not deposited on a portion of the substrate S corresponding to the blocking portion 310, the deposition material is deposited into a pattern shape on a portion of the substrate S corresponding to the pattern portion 320, the deposition material is deposited over the entire surface of the substrate S corresponding to the second opening area 201 except areas corresponding to the blocking portion 310 and the pattern portion 320, and a common layer may be formed on the substrate S accordingly.

In detail, because the second mask 300 includes the blocking portion 310 that corresponds to one hole located in the non-display area that is within the display area of the display device, the deposition material, therefore, may not be deposited in the area of the substrate S corresponding to the hole during the deposition process. In addition, as the second mask 300 includes the pattern portion 320 located corresponding to the display area of the display device, the deposition material may be deposited during the deposition process on an area of the substrate S corresponding to the pattern portion 320 into a planar shape corresponding to the planar shape of the plurality of holes h of the pattern portion 320.

According to an embodiment of the present invention, the second mask 300 may closely contact the substrate S. Accordingly, the deposition material may not be deposited on the area of the substrate S corresponding to the blocking portion 310, and the deposition material may be deposited into a precise pattern on the area of the substrate S corresponding to the pattern portion 320.

Hereinafter, an organic light emitting display device manufactured using the mask assembly 10 according to an embodiment will be described with reference to FIGS. 7 and 8.

Figure 7:
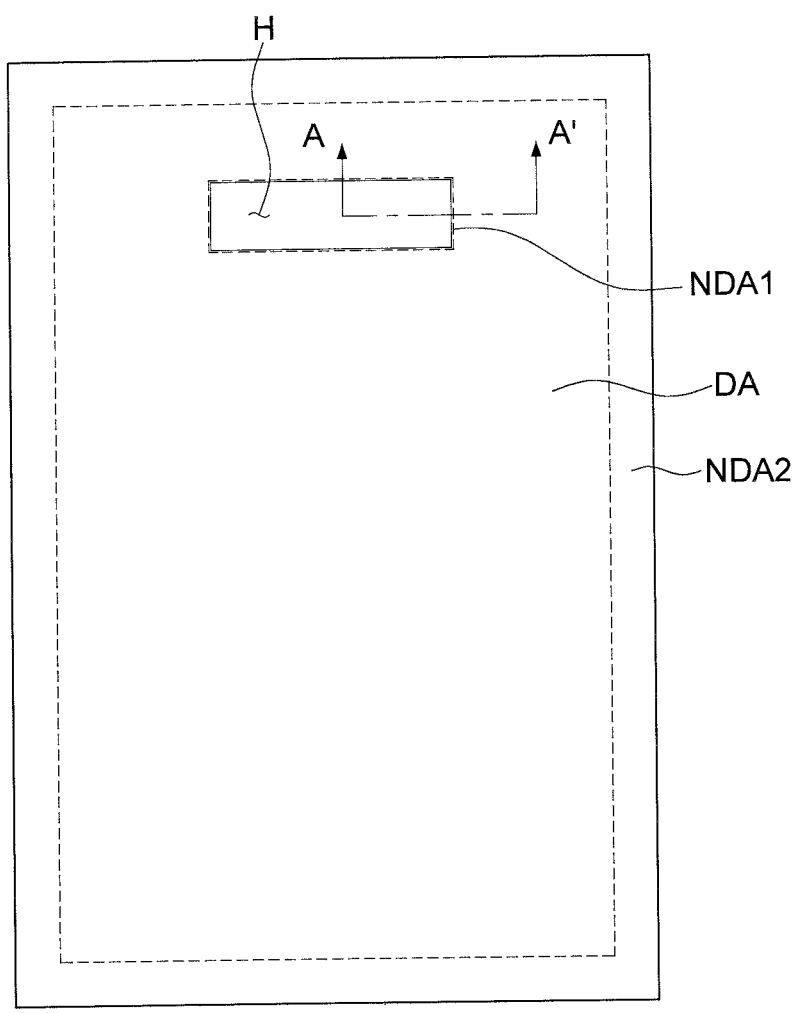
FIG. 7 is a plan view schematically illustrating an organic light emitting display device manufactured using a mask assembly according to an embodiment of the present invention.
Figure 8:
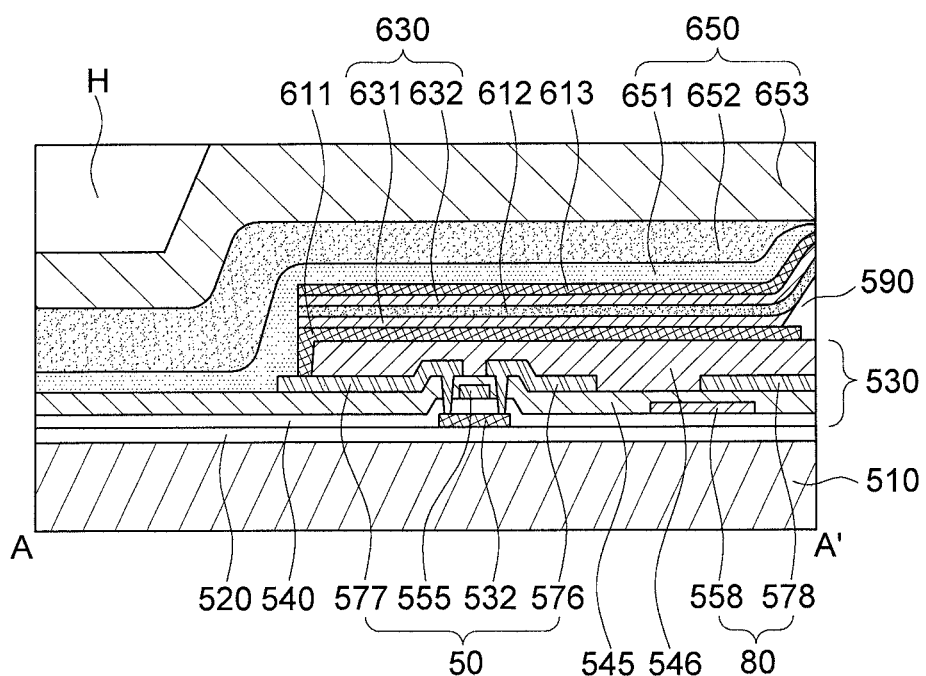
FIG. 8 is a cross-sectional view taken along the line A-A' in FIG. 7.

FIG. 7 is a plan view schematically illustrating an organic light emitting display device (hereinafter, "organic light emitting diode ("OLED") display device") manufactured using a mask assembly according to an embodiment of the present invention, and FIG. 8 is a cross-sectional view taken along the line A-A' in FIG. 7.

Referring to FIG. 7, the OLED display device according to an embodiment of the present invention includes a display area DA for displaying images, a first non-display area NDA1 located in the display area DA, and a second non-display area NDA2 located around the display area DA.

The OLED display device according to an embodiment of the present invention includes a functional member located at the first non-display area NDA1. For example, the OLED display device may have a hole H located at the first non-display area NDA1, and the functional member may be located in the hole H. In such an embodiment, the functional member may be a camera, a sensor, an LED, a speaker, and/or the like.

FIG. 8 schematically shows a cross-section of a part of the hole H and one pixel located adjacent to the hole H in the first non-display area NDA1. Referring to FIG. 8, an OLED display device according to an embodiment of the present invention includes a substrate 510, a buffer layer 520, a wiring unit 530, a gate insulating layer 540, a thin film transistor ("TFT"), a capacitor 80, a first pixel electrode 611, an organic light emitting layer 612, a second pixel electrode 613, an organic layer 630, a thin film encapsulation layer 650, and the like.

The substrate 510 may include an insulating material of glass, quartz, ceramic, plastic, or the like. However, embodiments are not limited thereto, and the substrate 510 according to an embodiment may include a metallic material such as stainless steel.

The buffer layer 520 is located on the substrate 510. The buffer layer 520 may include one or more layers selected from various inorganic layers and organic layers. The buffer layer 520 serves to reduce or substantially prevent permeation of undesirable elements, such as impurities or moisture, into the wiring unit 530 or the OLED, and to planarize a surface therebelow. However, the buffer layer 520 is not invariably necessary, and may be omitted according to the type and process conditions of the substrate 510.

The wiring unit 530 is located on the buffer layer 520. The wiring unit 530 corresponds to a portion including a switching thin film transistor ("TFT"), a driving TFT 50, and a capacitor 80. The wiring unit 530 drives the OLED. The OLED emits light according to a driving signal received from the wiring unit 530 to display images.

Each pixel may include two TFTs and one capacitor, but embodiments are not limited thereto. For example, each pixel of the OLED display device may include three or more TFTs and two or more capacitors, and may further include additional wirings. Herein, the term "pixel" refers to a smallest unit for displaying images, and the OLED display device displays images using a plurality of pixels.

The switching TFT, the driving TFT 50, the capacitor 80, and the OLED are provided in each pixel PX. In addition, a gate line located along one direction, and a data line and a common power line insulated from and crossing the gate line, are located in the wiring unit 530. One pixel may be defined by a gate line, a data line, and a common power line, but embodiments are not limited thereto. Pixels may be defined by a pixel defining layer 590 or by a black matrix.

The OLED includes a plurality of first pixel electrodes 611 located on the substrate 510, an organic light emitting layer 612 located on the plurality of first pixel electrodes 611, and a second pixel electrode 613 located on the organic light emitting layer 612. Holes and electrons are injected into the organic light emitting layer 612 from the plurality of first pixel electrodes 611 and the second pixel electrode 613, respectively. When the excitons formed by the injection of the injected holes and electrons fall from the excited state to the ground state, light emission occurs. According to an embodiment of the present invention, the first pixel electrode 611 may be located in each of the pixels described above. That is, one first pixel electrode 611 may be located corresponding to one pixel.

The capacitor 80 includes a pair of capacitor plates 558 and 578 with an insulating interlayer 545 interposed therebetween. In such an embodiment, the insulating interlayer 545 may be a dielectric element. A capacitance of the capacitor 80 may be determined by electric charges accumulated in the capacitor 80 and a voltage between the pair of capacitor plates 558 and 578.

The switching TFT includes a switching semiconductor layer, a switching gate electrode, a switching source electrode, and a switching drain electrode. The driving TFT 50 includes a driving semiconductor layer 532, a driving gate electrode 555, a driving source electrode 576, and a driving drain electrode 577. The semiconductor layers and the gate electrodes are insulated by the gate insulating layer 540.

The switching TFT may function as a switching element that selects a pixel to perform light emission. The switching gate electrode is connected to the gate line, and the switching source electrode is connected to the data line. Spaced apart from the switching source electrode, the switching drain electrode is connected to one of the capacitor plates, e.g., the capacitor plate 558.

The driving TFT 50 applies, to a first pixel electrode 611, a driving power that allows the light emitting layer 612 of the OLED in the selected pixel to emit light. The driving gate electrode 555 is connected to the one capacitor plate 558 that is connected to the switching drain electrode. Each of the driving source electrode 576 and the other of the capacitor plates (e.g., the capacitor plate 578) is connected to the common power line. The driving drain electrode 577 is connected to the first pixel electrode 611 of the OLED through a contact hole.

With the above-described structure, the switching TFT is driven based on a gate voltage applied to the gate line, and serves to transmit a data voltage applied to the data line to the driving TFT 50. A voltage that is equivalent to a difference between a common voltage applied to the driving TFT 50 from the common power line and the data voltage transmitted by (or from) the switching TFT is stored in the capacitor 80, and a current corresponding to the voltage stored in the capacitor 80 flows to the OLED through the driving TFT 50 such that the OLED may emit light.

In an embodiment, the first pixel electrode 611 is an anode for injecting holes, and the second pixel electrode 613 is a cathode for injecting electrons. However, embodiments are not limited thereto, and the first pixel electrode 611 may be a cathode, and the second pixel electrode 613 may be an anode.

A planarization layer 546 is located on the insulating interlayer 545. The planarization layer 546 includes an insulating material and protects the wiring unit 530. The planarization layer 546 and the insulating interlayer 545 may include substantially the same material.

The drain electrode 577 of the driving thin film transistor 20 is connected to the first pixel electrode 611 of the OLED through a contact hole defined in the planarization layer 546.

According to an embodiment, the first pixel electrode 611 may be a reflective electrode, and the second pixel electrode 613 may be a transflective electrode. Accordingly, a light generated in the light emitting layer 612 is emitted through the second pixel electrode 613. That is, the display device according to an embodiment of the present invention may have a top emission type structure.

The reflective layer and the transflective electrode may include one or more metals of: magnesium (Mg), silver (Ag), gold (Au), calcium (Ca), lithium (Li), chromium (Cr), copper (Cu) and aluminum (Al), or an alloy thereof.

For example, the first pixel electrode 611 may include a reflective layer including one or more metals of: magnesium (Mg), silver (Ag), gold (Au), calcium (Ca), lithium (Li), chromium (Cr), copper (Cu) and aluminum (Al), and a transparent conductive layer on the reflective layer. In addition, the first pixel electrode 611 may have a triple-layer structure in which a transparent conductive layer, a reflective layer and a transparent conductive layer are sequentially stacked.

The second pixel electrode 613 may include a transflective layer including one or more metals of: magnesium (Mg), silver (Ag), gold (Au), calcium (Ca), lithium (Li), chromium (Cr), copper (Cu) and aluminum (Al).

The organic light emitting layer 612 may include a monomer or polymer organic material. The organic light emitting layer 612 may be formed by a known method using a known organic light emitting material.

The pixel defining layer 590 is located between respective ones of the plurality of first pixel electrodes 611. That is, the pixel defining layer 590 defines an opening exposing at least a part of the first pixel electrode 611. The first pixel electrode 611, the organic light emitting layer 612, and the second pixel electrode 613 are sequentially stacked in the opening of the pixel defining layer 590 in the order listed. The second pixel electrode 613 is located on the pixel defining layer 590 as well as on the organic light emitting layer 612, but embodiments are not limited thereto. The OLED generates light in the organic light emitting layer 612 located in the opening of the pixel defining layer 590. As described above, the light emitting area may be defined by the pixel defining layer 590.

The organic layer 630 includes a first organic layer 631 between the first pixel electrode 611 and the organic light emitting layer 612, and a second organic layer 632 located between the organic light emitting layer 612 and the second pixel electrode 613.

The organic layer 630 may include an organic material (e.g., a monomer or polymer organic material).

The first organic layer 631 may include at least one of a hole injection layer (HIL) and a hole transporting layer (HTL). In addition, the first organic layer 631 may include both of the hole injection layer (HIL) and the hole transporting layer (HTL).

The second organic layer 632 may include at least one of an electron transporting layer (ETL) and an electron injection layer (EIL). In addition, the second organic layer 632 may include both of the electron injection layer (EIL) and the electron transporting layer (ETL).

The OLED according to an embodiment of the present invention may include only one of the first organic layer 631 and the second organic layer 632, or may include both of the first organic layer 631 and the second organic layer 632.

According to an embodiment of the invention, the organic layer 630 may be formed having a pattern. The structure of the organic layer 630 will be described in more detail below with reference to FIGS. 9 to 13.

The thin film encapsulation layer 650 is located on the second pixel electrode 613. The thin film encapsulation layer 650 includes at least one inorganic layer 651 and 653 and at least one organic layer 652, which are alternately located. In FIG. 8, the thin film encapsulation layer 650 includes two inorganic layers 651 and 653 and one organic layer 652, but embodiments are not limited thereto.

Each of the inorganic layers 651 and 653 may include one or more inorganic materials of: $Al_2O_3$, $TiO_2$, $ZrO$, $SiO_2$, $AlON$, $AlN$, $SiON$, $Si_3N_4$, $ZnO$ and/or $Ta_2O_5$. The organic layer 652 may include a polymer-based material. Examples of the polymer-based material may include, for example, an acrylic resin, an epoxy resin, polyimide, and polyethylene.

The inorganic layers 651 and 653, which have a high density and are relatively thin, may prevent or efficiently reduce infiltration of, mostly, moisture or oxygen. Permeation of moisture and oxygen into the OLED may be largely reduced or prevented by the inorganic layers 651 and 653. The moisture and oxygen that have passed through the inorganic layers 651 and 653 are blocked again by the organic layer 652. The organic layer 652 has a smaller effect of preventing moisture permeation than the inorganic layers 651 and 653. However, the organic layer 652 may also serve as a buffer layer to reduce stress among respective ones of the inorganic layers 651 and 653, in addition to the moisture-permeation preventing function. In addition, because the organic layer 652 has planarizing characteristics, an uppermost surface of the thin film encapsulation layer 650 may be planarized.

Hereinafter, the organic layer 630 according to an embodiment of the present invention will be described in detail with reference to FIGS. 9 to 11.

Figure 9:
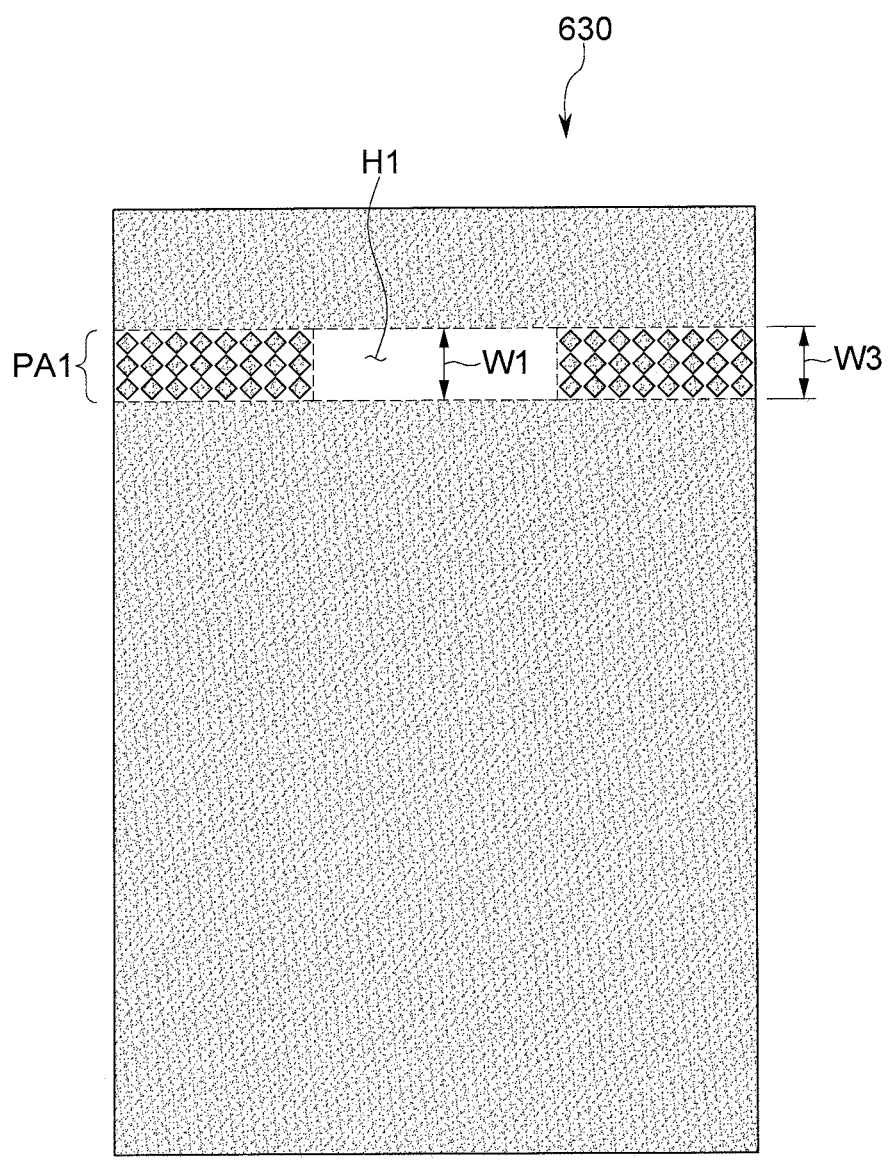
FIG. 9 is a plan view schematically illustrating an organic layer deposited using a mask assembly according to an embodiment of the present invention.

FIG. 9 is a plan view schematically illustrating an organic layer deposited using a mask assembly according to an embodiment of the present invention.

The organic layer 630 according to an embodiment of the present invention includes a first hole H1 located corresponding to the hole H in the first non-display area NDA1 of the display device, and an organic pattern portion PA1 located in the display area DA of the display device adjacent to the first hole H1. In addition, the organic layer 630 is located over the entire surface of the substrate in the display area DA except for the area where the organic pattern PA1 is located.

The organic pattern portion PA1 may be located adjacent to the first hole H1 and along at least one side of a long side or a short side of the display device. For example, as illustrated in FIG. 9, the organic pattern portion PA1 may be located parallel to the short side of the display device.

The organic pattern portion PA1 may have a width that is substantially equal to a width of the first hole H1. For example, as illustrated in FIG. 9, when the organic pattern portion PA1 is located along the short side of the display device, a width W1 of the first hole H1 is substantially equal to a width W3 of the organic pattern portion PA1. In such an embodiment, the widths W1 and W3 of the first hole H1 and the organic pattern portion PA1 refer to the width in the long side direction of the display device. However, embodiments are not limited thereto, and the width W1 of the first hole H1 may be different from the width W3 of the organic pattern portion PA1 depending on the process conditions of the display device.

The organic pattern portion PA1 may be in the form in which one of shapes of a circle, an ellipse, or a polygon is repeatedly arranged on a plane. For example, as illustrated in FIG. 9, the organic pattern portion PA1 may be in the form in which rhombic shapes are repeatedly arranged.

In such an embodiment, when the organic layer 630 is formed using the mask assembly 10 according to an embodiment of the present invention, the first hole H1 of the organic layer 630 may be defined in the location, and may have a planar shape corresponding to those of the blocking portion 310 of the second mask 300, the organic pattern portion PA1 of the organic layer 630 may be formed in the location corresponding to the pattern portion 320 of the second mask 300, and each of the shapes of the organic pattern portion PA1 may be formed in the location of, and may have a planar shape corresponding to, those of the hole h of the pattern portion 320 of the second mask 300.

Figure 10:
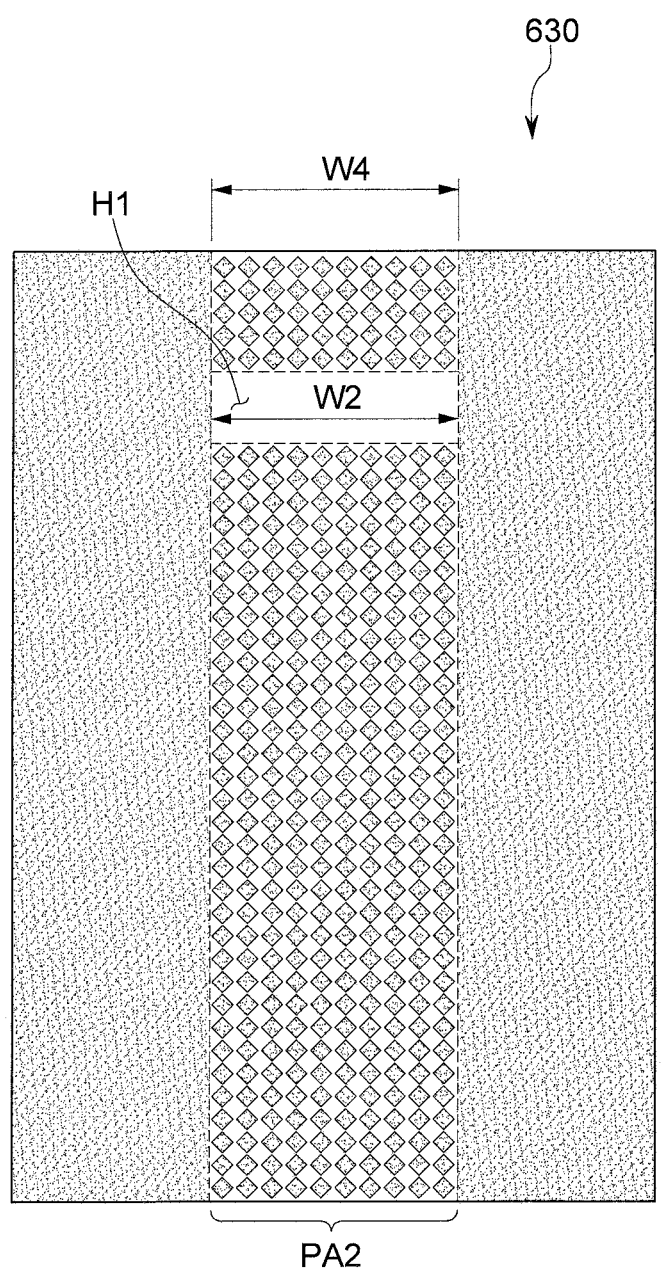
FIG. 10 is a plan view schematically illustrating an organic layer deposited using a mask assembly according to another embodiment of the present invention.

FIG. 10 is a plan view schematically illustrating an organic layer 630 deposited using a mask assembly 20 according to another embodiment of the present invention.

The organic layer 630 according to the present embodiment includes a first hole H1 located corresponding to the hole H in the first non-display area NDA1 of the display device, and an organic pattern portion PA2 located in the display area DA of the display device adjacent to the first hole H1. In addition, the organic layer 630 is located over the entire surface of the substrate in the display area DA except for the area where the organic pattern PA2 is located.

The organic pattern portion PA2 may be located adjacent to the first hole H1 and along at least one side of a long side or a short side of the display device. For example, as illustrated in FIG. 10, the organic pattern portion PA2 may be located parallel to the long side of the display device.

The organic pattern portion PA2 may have a width substantially equal to a width of the first hole H1. For example, as illustrated in FIG. 10, when the organic pattern portion PA2 is located along the long side of the display device, a width W2 of the first hole H1 is substantially equal to a width W4 of the organic pattern portion PA2. In such an embodiment, the widths W2 and W4 of the first hole H1 and the organic pattern portion PA2 refer to the width in the short side direction of the display device. However, embodiments are not limited thereto, and the width W2 of the first hole H1 may be different from the width W4 of the organic pattern portion PA2 depending on the process conditions of the display device.

The organic pattern portion PA2 may be in the form in which one of shapes of a circle, an ellipse, or a polygon is repeatedly arranged on a plane. For example, as illustrated in FIG. 10, the organic pattern portion PA2 may be in the form in which rhombic shapes are repeatedly arranged.

In such an embodiment, when the organic layer 630 is formed using the mask assembly 20 according to another embodiment of the present invention, the first hole H1 of the organic layer 630 may be defined in the location of, and may have a planar shape corresponding to, those of the blocking portion 310 of the second mask 300, the organic pattern portion PA2 of the organic layer 630 may be formed in the location corresponding to the pattern portion 320 of the second mask 300, and each of the shapes of the organic pattern portion PA2 may be formed in the location of, and may have a planar shape corresponding to, those of the hole h of the pattern portion 320 of the second mask 300.

Figure 11:
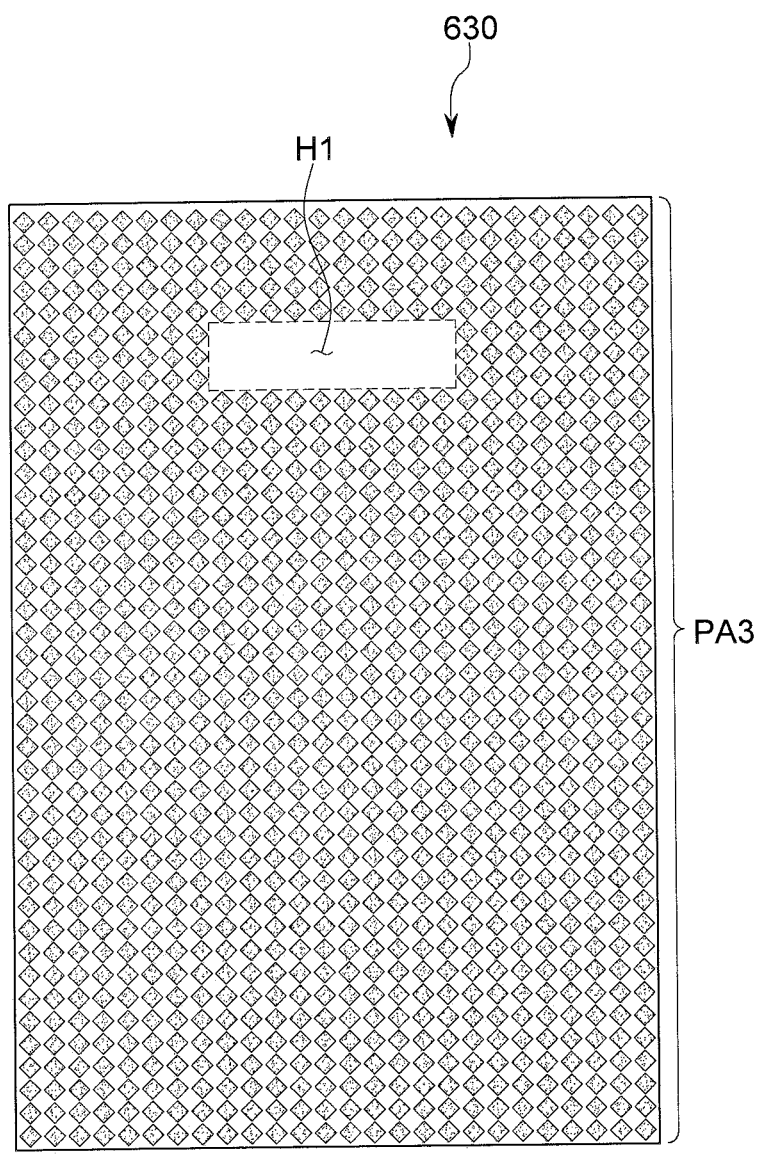
FIG. 11 is a plan view schematically illustrating an organic layer deposited using a mask assembly according to still another embodiment of the present invention.

FIG. 11 is a plan view schematically illustrating an organic layer deposited using a mask assembly according to still another embodiment of the present invention.

The organic layer 630 according to still another embodiment of the present invention includes a first hole H1 located corresponding to the hole H in the first non-display area NDA1 of the display device, and an organic pattern portion PA3 located in the display area DA of the display device and surrounding the first hole H1. That is, the organic pattern portion PA3 is located over the entire surface of the substrate in the display area DA.

Figure 12:
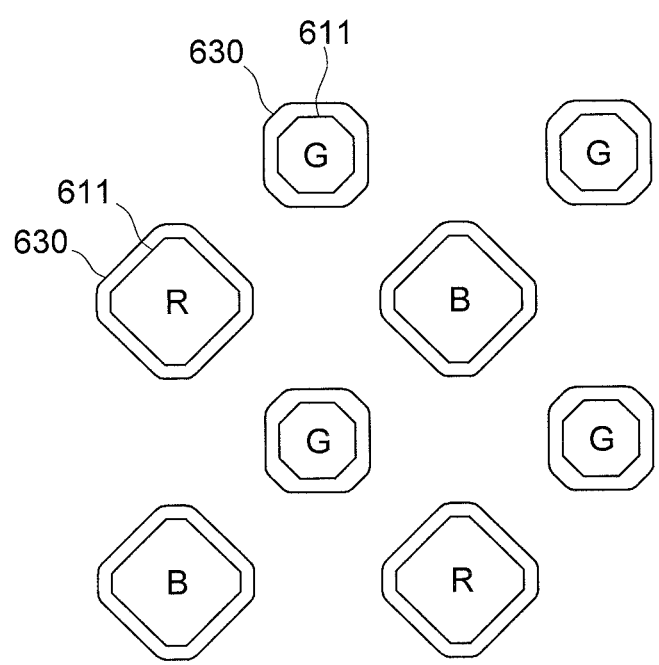
FIG. 12 is a plan view schematically illustrating a first pixel electrode and an organic layer according to an embodiment of the present invention.

The organic pattern portion PA3 may be in the form in which one of shapes of a circle, an ellipse, or a polygon is repeatedly arranged on a plane. For example, as illustrated in FIG. 12, the organic pattern portion PA3 may be in the form in which rhombic shapes are repeatedly arranged.

In such an embodiment, when the organic layer 630 is formed using the mask assembly according to still another embodiment of the present invention, the first hole H1 of the organic layer 630 may be defined in the location of, and may have a planar shape corresponding to, those of the blocking portion of the pattern mask. Also, the organic pattern portion PA3 of the organic layer 630 may be formed in the location corresponding to the pattern portion of the pattern mask, and each of the shapes of the organic pattern portion PA3 may be formed in the location of, and may have a planar shape corresponding to, those of the hole of the pattern portion of the pattern mask.

In an embodiment, as another embodiment, the organic light emitting layer 612 may be located in the same structure as the organic layer 630 as described hereinabove with reference to FIGS. 9 to 11. That is, the organic light emitting layer 612 may also have a hole located in the first non-display area NDA1 of the display device, and may include a pattern portion having substantially the same shape as the organic pattern portions PA1, PA2, and PA3 of the organic layer 630 described above.

Although not illustrated, an organic layer or an inorganic layer that protects the OLED and helps the light emitted from the organic light emitting layer 612 to be efficiently emitted to the outside may be further located on the second pixel electrode 613 of the OLED display device. Such an organic layer or inorganic layer may be located in the same structure as the organic layer 630 as described above with reference to FIGS. 9 to 11. That is, such an organic layer or inorganic layer may also have a hole located in the first non-display area NDA1 of the display device, and may include a pattern portion having substantially the same shape as the organic pattern portions PA1, PA2, or PA3 of the organic layer 630 described above.

Hereinafter, the first pixel electrode 611 and the organic layer 630 will be described in detail with reference to FIGS. 12 and 13.

Figure 13:
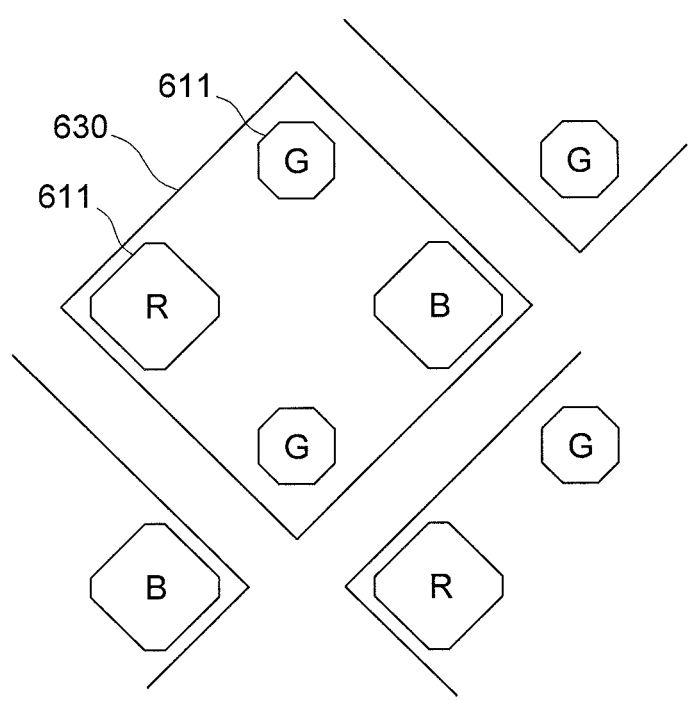
FIG. 13 is a plan view schematically illustrating a first pixel electrode and an organic layer according to another embodiment of the present invention.

FIG. 12 is a plan view schematically illustrating a first pixel electrode and an organic layer according to an embodiment of the present invention, and FIG. 13 is a plan view schematically illustrating a first pixel electrode and an organic layer according to another embodiment of the present invention.

When the organic layer 630 includes the organic pattern portion in which the polygonal shape is repeatedly arranged as described with reference to FIGS. 9 to 11, each repeated polygonal shape of the organic pattern portion may overlap the pixel located at the display area of the substrate. For example, each shape of the organic pattern portion may overlap the first pixel electrode 611 that is located in each pixel.

According to an embodiment of the present invention, each of the shapes of the organic pattern portion of the organic layer 630 may overlap one of the first pixel electrodes 611 on a plane. For example, as illustrated in FIG. 12, each of the shapes of the organic pattern portion of the organic layer 630 is octagonal on a plane, and may overlap one first pixel electrode 611.

According to another embodiment of the present invention, each of the shapes of the organic pattern portion of the organic layer 630 may overlap two, four, eight, or more first pixel electrodes 611 on a plane. For example, as illustrated in FIG. 13, each of the shapes of the organic pattern portion of the organic layer 630 is quadrangular on a plane, and may overlap four first pixel electrodes 611.

However, embodiments are not limited thereto, and the size of the shapes of the organic pattern portion of the organic layer 630 and the number of the first pixel electrodes 611 each shape of the organic pattern portion overlaps may be determined in consideration of the process conditions and resolution of the display device.

As set forth hereinabove, according to one or more embodiments, by using the mask assembly including the second mask that includes the light blocking portion and the pattern portion, the OLED display device having a hole in a display area may be manufactured.

While the present invention has been illustrated, and described with reference to the embodiments thereof, it will be apparent to those of ordinary skill in the art that various changes in form, and detail may be formed thereto without departing from the spirit, and scope of the present invention.

What is claimed is:

1. A mask assembly comprising:
a frame defining a first opening area;
a first mask on the frame and defining a plurality of second opening areas that overlap the first opening area; and
a second mask fixed to the frame, crossing the plurality of second opening areas, extending in a first direction, and comprising:
 a body portion overlapping the first mask;
 a blocking portion overlapping each respective one of the second opening areas; and
 a pattern portion between the body portion and the blocking portion, and defining a plurality of holes,
wherein a length of the blocking portion of the second mask is smaller than a length of each corresponding one of the second opening areas of the first mask in the first direction, and
wherein a width of the blocking portion of the second mask is smaller than a width of each corresponding one of the second opening areas of the first mask in a second direction perpendicular to the first direction.

2. The mask assembly of claim 1, wherein the second mask extends in a lengthwise direction of the first mask.

3. The mask assembly of claim 1, wherein the second mask extends in a widthwise direction of the first mask.

4. The mask assembly of claim 1, wherein the blocking portion has a width substantially equal to a width of the pattern portion.

5. The mask assembly of claim 1, wherein the blocking portion and the pattern portion have an area in a range from about 1% to about 50% of an area of the second opening areas.

6. The mask assembly of claim 1, wherein the plurality of holes have an area in a range from about 50% to about 80% of an area of the pattern portion.

7. The mask assembly of claim 1, wherein the second mask has a thickness in a range from about 80 μm to about 300 μm.

8. The mask assembly of claim 1, wherein a shape of each of the plurality of holes comprises one of a circle, an ellipse, or a polygon on a plane.

9. The mask assembly of claim 1, wherein the frame defines a groove at a position overlapping the second mask, and
 wherein a shape of the second mask is such that a portion of the second mask is configured to be inserted into the groove.

10. The mask assembly of claim 1, wherein the second mask is bent at an end thereof to extend toward a side surface of the frame, and is fixed to the frame.

11. The mask assembly of claim 1, wherein each of the first mask and the second mask comprises one of stainless steel (SUS), an invar alloy, nickel (Ni), cobalt (Co), a nickel alloy, or a nickel-cobalt alloy.

* * * * *